(12) United States Patent
Chandra et al.

(10) Patent No.: US 10,067,187 B2
(45) Date of Patent: Sep. 4, 2018

(54) HANDLING OF UNDESIRABLE DISTRIBUTION OF UNKNOWN VALUES IN TESTING OF CIRCUIT USING AUTOMATED TEST EQUIPMENT

(71) Applicant: Synopsys, Inc., Mountain View, CA (US)

(72) Inventors: Anshuman Chandra, Sunnyvale, CA (US); Subramanian Chebiyam, Sunnyvale, CA (US); Jyotirmoy Saikia, Bangalore (IN); Parthajit Bhattacharya, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 905 days.

(21) Appl. No.: 14/335,720

(22) Filed: Jul. 18, 2014

(65) Prior Publication Data

US 2015/0025819 A1    Jan. 22, 2015

Related U.S. Application Data (60) Provisional application No. 61/856,474, filed on Jul. 19, 2013.

(51) Int. Cl.
*G01R 31/3185*    (2006.01)

(52) U.S. Cl.
CPC ............... *G01R 31/318547* (2013.01); *G01R 31/318544* (2013.01)

(58) Field of Classification Search
CPC ........ G01R 31/318536; G01R 31/3183; G01R 31/318547
See application file for complete search history.

(56) References Cited

U.S. PATENT DOCUMENTS

| | | | |
|---|---|---|---|
| 5,475,695 | A | 12/1995 | Caywood et al. |
| 6,122,756 | A | 9/2000 | Baxter |
| 6,148,425 | A | 11/2000 | Bhawmik et al. |
| 6,185,707 | B1 | 2/2001 | Smith et al. |
| 6,288,955 | B1 | 9/2001 | Shibano et al. |
| 6,418,545 | B1 | 7/2002 | Adusumilli |
| 6,557,129 | B1 | 4/2003 | Rajski et al. |

(Continued)

OTHER PUBLICATIONS

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

(Continued)

*Primary Examiner* — Patrick King
(74) *Attorney, Agent, or Firm* — Fenwick & West LLP (57) ABSTRACT

A method for masking scan chains in a test circuit of an integrated circuit is disclosed. The test circuit includes multiple mask banks. Different mask patterns are stored in each of the mask banks. A first mask bank of the multiple mask banks is selected and the mask pattern stored in the selected first mask bank is used for masking the output of the scan chains of the test circuit during a first portion of a test cycle. A second mask bank of the multiple mask banks is selected and the ask pattern stored in the selected second mask bank is used for masking the output of the scan chains of the test circuit during a second portion of the test cycle.

19 Claims, 8 Drawing Sheets

(56) References Cited

U.S. PATENT DOCUMENTS

| | | | |
|---|---|---|---|
| 6,618,830 | B1 | 9/2003 | Balachandran et al. |
| 7,139,948 | B2 | 11/2006 | Rearick et al. |
| 7,370,254 | B2 | 5/2008 | Rajski et al. |
| 7,657,790 | B2 * | 2/2010 | Whetsel ......... G01R 31/318536 324/750.3 |
| 7,859,285 | B2 | 12/2010 | Sheu et al. |
| 8,261,142 | B2 | 9/2012 | Guo et al. |
| 8,694,951 | B1 | 4/2014 | Prasanna et al. |
| 8,904,256 | B1 * | 12/2014 | Chakravadhanula ....................... G01R 31/318547 714/729 |
| 2004/0230884 | A1 | 11/2004 | Rajski et al. |
| 2005/0055617 | A1 | 3/2005 | Wang et al. |
| 2006/0111873 | A1 | 5/2006 | Huang et al. |
| 2007/0061637 | A1 | 3/2007 | Ward et al. |
| 2007/0143651 | A1 | 6/2007 | Kiryu |
| 2007/0179731 | A1 | 8/2007 | Suri et al. |
| 2007/0234150 | A1 * | 10/2007 | Jain ................ G01R 31/318544 714/726 |
| 2007/0234169 | A1 | 10/2007 | Rajski et al. |
| 2008/0294955 | A1 | 11/2008 | Kapur et al. |
| 2008/0301510 | A1 | 12/2008 | Kapur et al. |
| 2009/0053628 | A1 | 2/2009 | Ye et al. |
| 2009/0240458 | A1 | 9/2009 | Desineni et al. |
| 2010/0017760 | A1 | 1/2010 | Kapur et al. |
| 2010/0090706 | A1 * | 4/2010 | Malach .......... G01R 31/318547 324/537 |
| 2010/0146350 | A1 | 6/2010 | Lin et al. |
| 2010/0192030 | A1 | 7/2010 | Kapur et al. |
| 2011/0239068 | A1 * | 9/2011 | Whetsel ......... G01R 31/318536 714/729 |
| 2011/0258498 | A1 | 10/2011 | Chandra et al. |
| 2011/0307750 | A1 * | 12/2011 | Narayanan ..... G01R 31/318547 714/729 |
| 2014/0229779 | A1 | 8/2014 | Rajski et al. |

OTHER PUBLICATIONS

Chandra, A. et al., "Scalable Adaptive Scan (SAS)," EDAA, 2009, 6 pages.

Devanathan, V.R. et al., "Reducing SoC Test Time and Test Power in Hierarchical Scan Test: Scan Architecture and Algorithms," IEEE 20th Int'l Conference on VLSI Design, VLSID'07, 2007, 6 pages.

Dutta et al., "Using Limited Dependence Sequential Expansion for Decompressing Test Vectors," IEEE Int'l Test Conference, 2006, Paper 23.1, pp. 1-9.

Gonciari, P.T. et al., "Compression Considerations in Test Access Mechanism Design," IEE Proc.—Comput. Digit. Tech, Jan. 2005, pp. 89-96, vol. 152, No. 1.

Iyengar, V. et al., "A Unified SOC Test Approach Based on Test Data Compression and TAM Design," Proceedings of the 18$^{th}$ IEEE International Symposium on Defect and Fault Tolerance in VLSI Systems, (DFT'03), IEEE, 2003, 8 pages.

Iyengar, V. et al., "Test Access Mechanism Optimization, Test Scheduling, and Tester Data Volume Reduction for System-on-Chip," IEEE Transactions on Computers, Dec. 2003, pp. 1619-1632, vol. 52, No. 12.

Kapur, R. et al., "Manufacturing Test of SoCs," Proceedings of the 11th Asian Test Symposium, (ATS'02), IEEE, 2002, 3 pages.

Larsson, A. et al., "Test-Architecture Optimization and Test Scheduling for SOCs with Core-Level Expansion of Compressed Test Patterns," EDAA, 2008, pp. 188-193.

Nadeau-Dostie, B. et al., "Improved Core Isolation and Access for Hierarchical Embedded Test," IEEE Design & Test of Computers, Jan./Feb. 2009, pp. 18-25.

Remmers, J. et al.,"Hierarchical DFT Methodology—A Case Study," ITC International Test Conference, IEEE, 2004 Paper 30.2, pp. 847-856.

Sinanoglu, O. et al., "A Non-Intrusive Isolation Approach for Soft Cores," EDAA, 2007, pp. 27-32.

Srinavasan, P. et al., "Hierarchical DFT with Combinational Scan Compression, Partition Chain and RPCT," 2010 IEEE Annual Symposium on VLSI, IEEE, 2010, pp. 52-57.

Su et al., "Multiple Path Sensitization for Hierarchical Circuit Testing," IEEE 1990 International Test Conference, Paper 6.2, pp. 152-161.

Su et al., "Computer-Aided Design of Pseudoexhaustive BIST for Semiregular Circuits," 1990 IEEE International Test Conference, 1990, Paper 30.4, pp. 680-689.

Wohl, P. et al., "Fully X-tolerant Combinational Scan Compression," 2007 IEEE International Test Conference, IEEE, 2007, Paper 6.1, pp. 1-10.

Wohl, P. et al., "Minimizing the Impact of Scan Compression," 25th IEEE VLSI Test Symposium (VTS'07), IEEE, 2007, 8 pages.

Xu, Q. et al., "Modular and Rapid Testing of SOCs With Unwrapped Logic Blocks," IEEE Transactions on Very Large Scale Integration (VLSI) Systems, Nov. 2005, pp. 1275-1285, vol. 13, No. 11.

\* cited by examiner

HANDLING OF UNDESIRABLE DISTRIBUTION OF UNKNOWN VALUES IN TESTING OF CIRCUIT USING AUTOMATED TEST EQUIPMENT

CROSS REFERENCE TO RELATED APPLICATION

This application claims the benefit of priority to U.S. Provisional Patent Application No. 61/856,474, filed Jul. 19, 2013, which is incorporated by reference herein in its entirety.

BACKGROUND

1. Field of the Disclosure

The present disclosure relates to applying masking to one or more scan chains in a testing circuit for testing an integrated circuit.

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop.

Outputs of multiple scan flops may be compressed into a bit stream to reduce data bandwidth and pins associated with the testing of IC. Compression of the output of the scan flop into a bit stream is lossy, and hence, the amount of information that may be extracted from the bit stream is decreased. For instance, an unexpected value on one of the bits of the bit stream may be associated with multiple scan flops and determination as to which scan flop caused the unexpected value may not be easily made.

An unknown value in the output of a scan chain is designated "X" to represent that it could be either a logic 0 or logic 1 in the expected scan-out data stream. X response values in output of scan chains are undesirable because it is unknown whether the design is faulty based on the scan output. In standard scan testing without compression, X values are simply ignored. However, when scan data is compressed, X values can interfere with known values and reduce fault coverage. Therefore, compression of scan output can reduce observability and worsen test coverage.

As the number of circuits integrated on a System-on-a-Chip (SOC) increases, building a hierarchical test infrastructure is becoming more importance. An efficient hierarchical design-for-test (DFT) implementation not only enables quality testing of the SOC but also provides an indispensable tool that can aid debugging the problems in the IC during manufacturing. With the evolution of compression technologies in the recent years, more and more people are migrating away from scan methodology for manufacturing test to save test cost and test time.

SUMMARY

Embodiments relate to masking the outputs of scan chains using multiple mask pattern during the same test cycle. Multiple mask patterns are loaded into multiple mask banks of a test circuit. During a first portion of a test cycle, a first mask bank storing a first mask pattern is selected. The first mask pattern is loaded into the compressor of the test circuit and is used for masking the output of the scan chains during the first portion of the test cycle.

During a second portion of the test cycle, a second mask bank storing a second mask pattern is selected. The second mask pattern is loaded into the compressor of the test circuit and is used for masking the output of the scan chains during the second portion of the test cycle.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to using multiple mask patterns for a single test cycle. Using different mask patterns in a single test cycle increases the number of faults that can be tested during the test cycle. For instance, two mask patterns, one that is designed taking into consideration the distribution of X values in the first half of the test cycle, and one that is designed taking into consideration the distribution of X values in the second half of the test cycle may be used to mask the X values in a test cycle instead of a single mask pattern that is designed taking into consideration the distribution of X values for the entire test cycle.

A test cycle described herein refers a period of testing an integrated circuit using a test pattern. Each test cycle may use a different test pattern. A test cycle may consist of a predetermined number of clock cycles.

Figure 1:
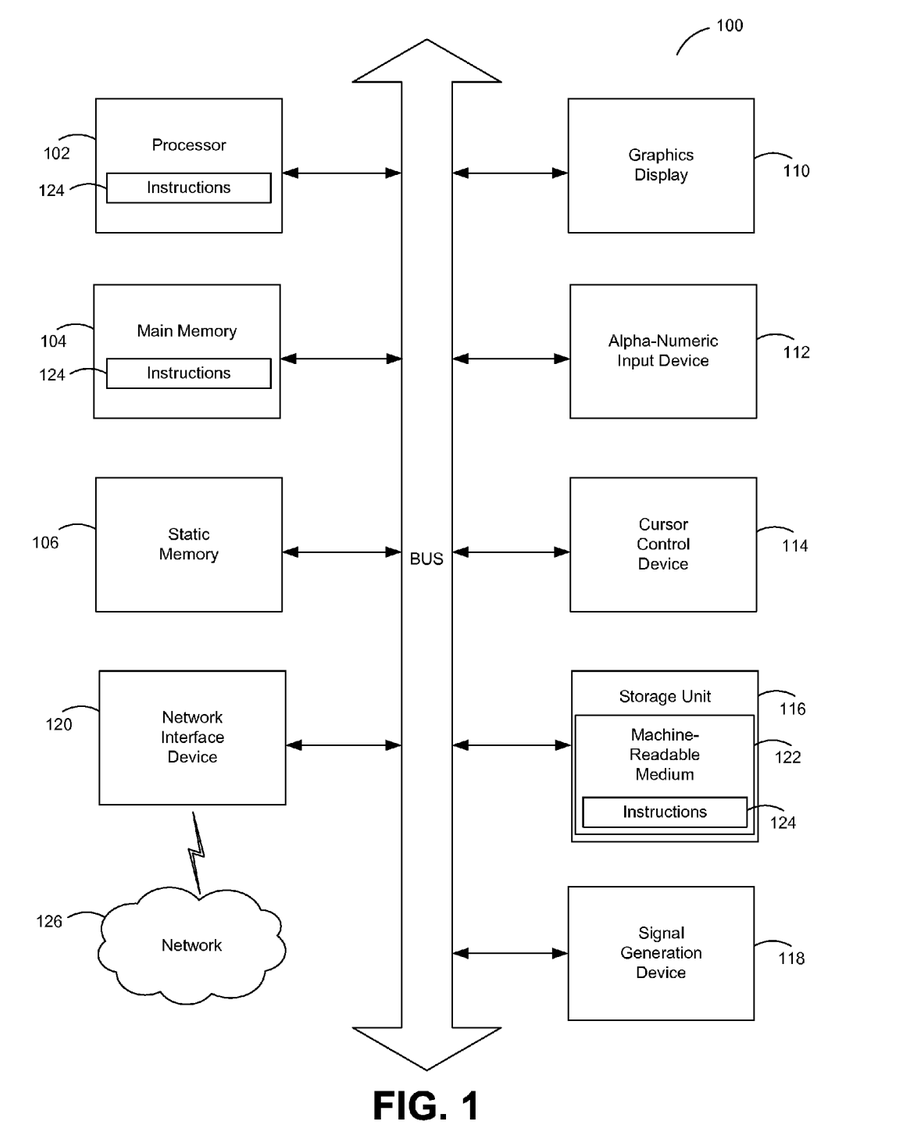
FIG. 1 is a block diagram of an example machine for executing electronic design automation (EDA) process.

FIG. 1 is a block diagram of an example machine for executing electronic design automation (EDA) process. Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 104, and a static memory 106, which are configured to communicate with each other via a bus 108. The computer system 100 may further include graphics display unit 110 (e.g., a plasma display panel (PDP), a liquid crystal display (LCD), a projector, or a cathode ray tube (CRT)). The computer system 100 may also include alphanumeric input device 112 (e.g., a keyboard), a cursor control device 114 (e.g., a mouse, a trackball, a joystick, a motion sensor, or other pointing instrument), a storage unit 116, a signal generation device 118 (e.g., a speaker), and a network interface device 820, which also are configured to communicate via the bus 108.

The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media. The instructions 124 (e.g., software) may be transmitted or received over a network 126 via the network interface device 120. The storage unit 116 may also store a digital representation of the design of a circuit and/or instruction for generating a digital representation of the circuit.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Figure 2A:
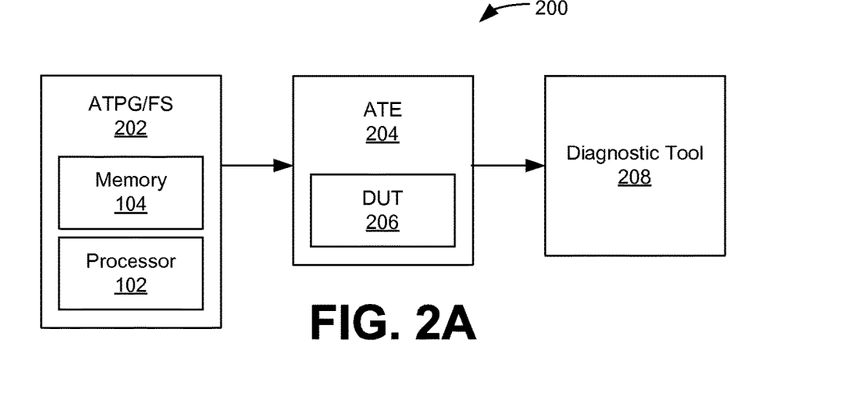
FIG. 2A is a block diagram illustrating a system for testing and diagnosing a device under test (DUT), according to one embodiment.

FIG. 2A is a block diagram illustrating a system 200 for testing and diagnosing a device under test (DUT) 206, according to one embodiment. DUT 206 is an integrated circuit (IC) that is being tested for faults in its fabrication process. The system 100 may include, among other components, an automatic test pattern generator/fault simulator (ATPG/FS) 202, an automatic test equipment (ATE) 204, and a diagnostic tool 208. One or more of these components may be combined into a single product or device.

ATPG/FS 202 generates test patterns provided to ATE 204 and scan-out values corresponding to the test patterns for detecting faults in DUT 206. Scan-out values represent the expected output from a faultless integrated circuit when provided with the test patterns. A test pattern includes scan-in data and control data for controlling test operation in DUT 206, as described below in detail with reference to FIG. 3A. Scan-in data changes for each shift of bit, and hence, the scan-in data may be referred to as a dynamic data. The control data stored in registers 329, 376 remains constant throughout a test pattern, and hence, this control pattern may be referred to as static data. ATE 204 provides the test patterns as scan-in data and control data to DUT 206, and captures output from DUT 206. The captured output from DUT 206 is compared with scan-out values. ATE 204 then generates fault data indicating the difference in the scan-out values and the output from DUT 206.

ATE 204 then sends fault data to diagnostic tool 208 to localize and diagnose the cause of faults in DUT 206. If a fault is detected based on an unexpected output of DUT 206, diagnostic tool 208 may request ATPG/FS 202 to generate further test patterns to localize or specify a scan flop associated with the unexpected value.

Figure 2B:
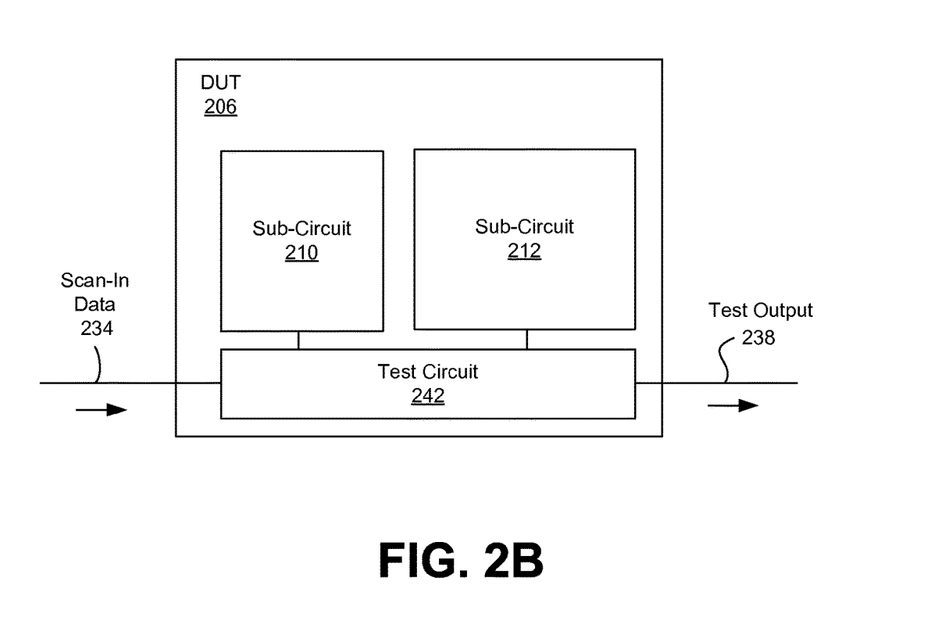
FIG. 2B is a block diagram of a DUT including a test circuit, according to one embodiment.

FIG. 2B is a block diagram of DUT 206 including a test circuit 242 for performing testing of sub-circuits in DUT 206, according to one embodiment. DUT 206 may include, among other components, one or more sub-circuits 210, 212 and test circuit 242. DUT 206 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 202 and sending test output data 238 (i.e., an output in response to the test patterns) to diagnostic tool 208.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2B as testing both sub-circuits 210, 212, more than one test circuit may be provided in DUT to separately test a certain sub-circuit. In embodiments with multiple test circuits, each test circuit may be connected to the same or different pins.

Figure 3A:
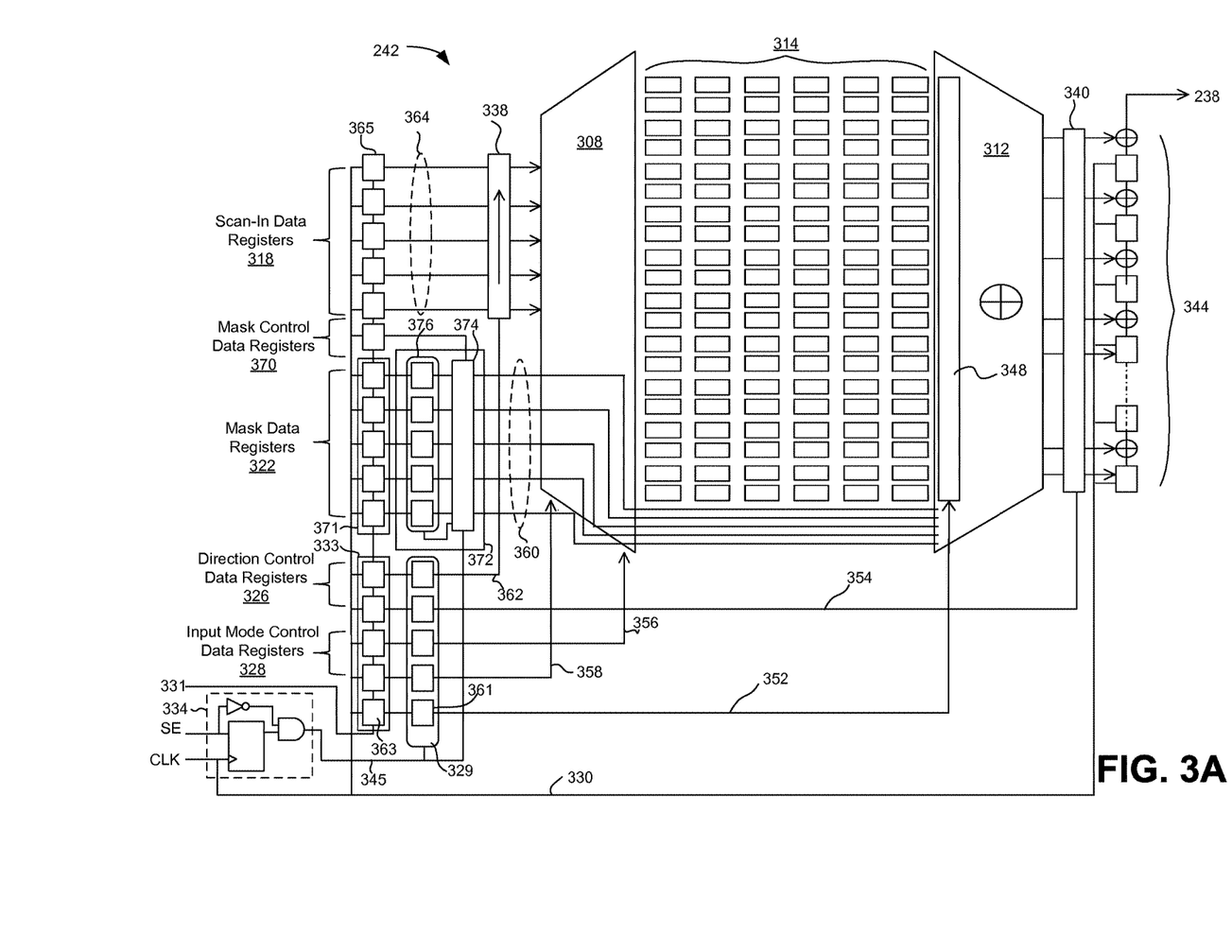
FIG. 3A is a circuit diagram of a test circuit in the DUT, according to one embodiment.

FIG. 3A is a circuit diagram of test circuit 242 in the DUT 206, according to one embodiment. Test circuit 242 may include, among other components, a decompressor 308, a compressor 312, chains of scan flops 314, input registers 318, 322, 326, 328, 329, 370, mask module 372, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329 and mask patterns stored in mask bank 376 of the mask module 372. Although a single mask bank is illustrated in FIG. 3A to store mask patterns, more than one mask bank may be used to store multiple mask patterns for use during a test cycle. Such architecture of test circuit where the test pattern includes scan-in data and control data is referred to herein as SAS.

Control logic 334 synchronizes the operation of components in test circuit 242 by providing a clock signal via line 345. When a clock signal is input to current control registers 329, the bit values in control registers 333 are loaded onto current control registers 329. Additionally, when a clock signal is input to the mask bank control logic 374, the bit values in mask registers 371 are loaded onto a mask bank 376 of the mask module 372. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom up to a scan-in data registers 365 at the top as bits for the current test pattern is received via line 331. Although a single line 331 is illustrated in FIG. 3A to receive the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 and mask module 372 via line 345. Current registers 329 stores control values and mask bank 376 stores a mask pattern until the next capture clock so that decompressor 308 and compressor 312 can be controlled without undergoing change with every shift of scan-in data. That is, registers 333 and 371 enable control values to be shifted to register 329 and 376 only once per pattern.

Mask control data registers 370 stores bit values for controlling the operation of mask module 372. For instance, if mask module 372 includes multiple mask banks 376, mask control data registers 370 may store bit values specifying a mask bank 376 for receiving and storing a mask pattern from the mask data registers 322. Mask control data registers 370 may also store bit values specifying how the mask banks 376 will be used to mask the output of the scan flops 314.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
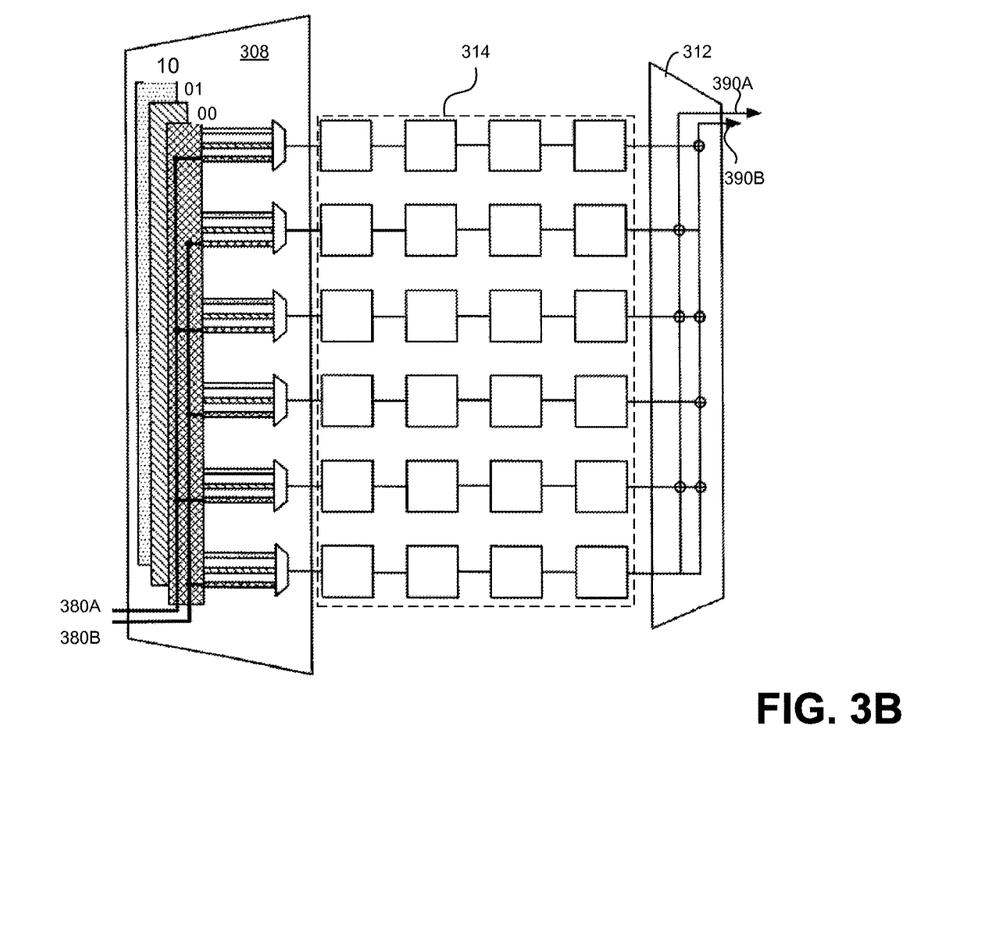
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask bank 376 define the masking of certain scan chains. The bit values of mask bank 376 are provided to compressor 312 via lines 360. In response to receiving mask enable signal via line 352 and active signals in lines 360, a mask block 348 in compressor 312 masks certain scan chains as defined by the bit values of mask bank 376. The mask enable bit value stored in register 361 is sent to mask block 348 to enable or disable masking operation via line 352. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of registers 329, 376 store bit values from a current test pattern and other registers 329, 376 store bit values from a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are defined by the previous test pattern. Conversely, bit value in direction control data registers 326 of current control registers 329 controlling output direction block 340 for the current test pattern, bit values in mask bank 376, and a bit value in mask enable register 361 of current control registers 329 are defined by the current test pattern.

FIG. 3B is a conceptual diagram illustrating the operation of decompressor 308 and compressor 312 in a test circuit, according to one embodiment. Decompressor 308 may be selected to operate in one of the selected modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 204 and diagnostic tool 208 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

Figure 4:
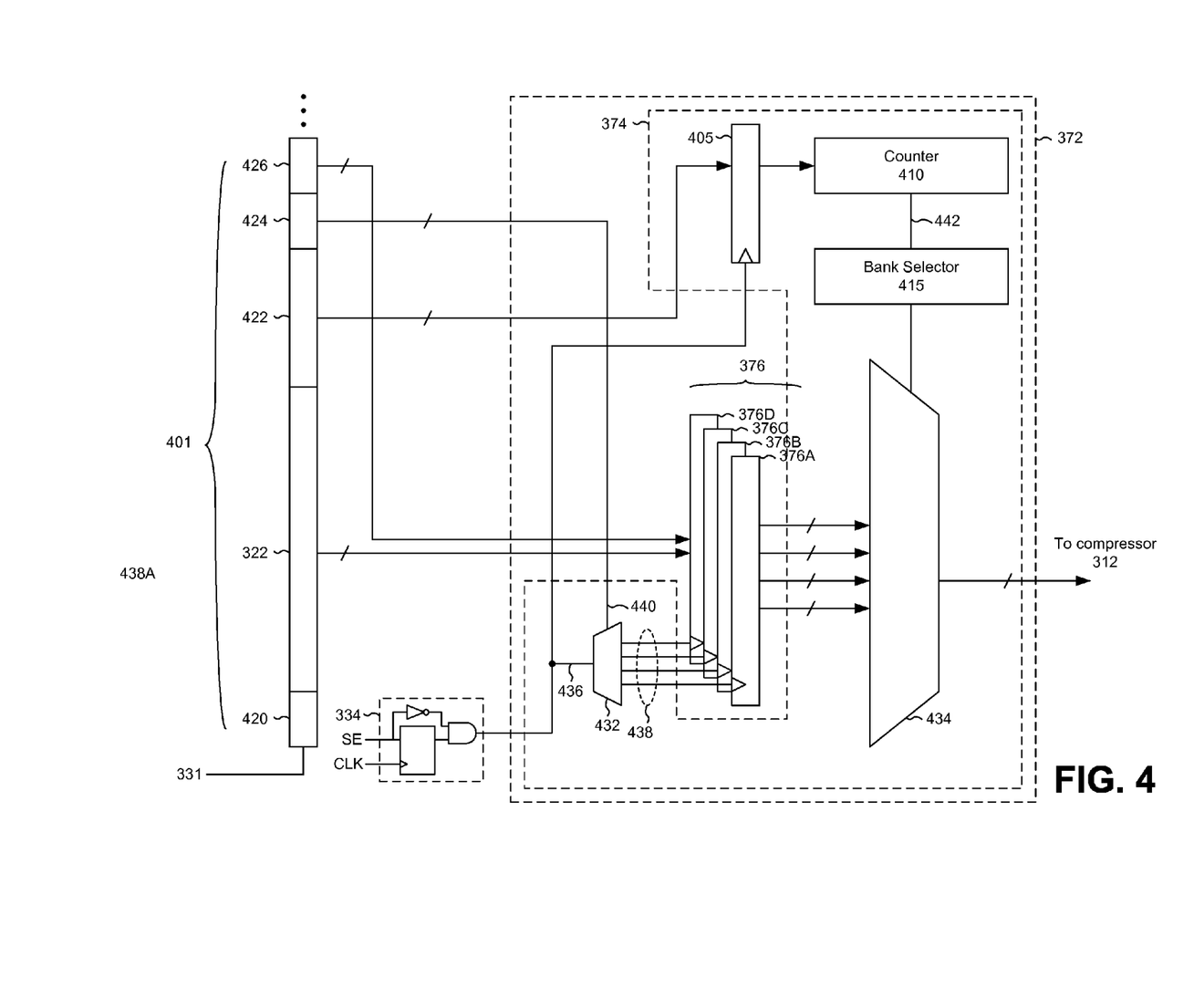
FIG. 4 is a schematic diagram illustrating a test circuit with multiple mask banks, according to one embodiment.

FIG. 4 is a detailed block diagram of the mask module 372, according to one embodiment. The mask module 372 includes, among other components, an interval register bank 405, a counter 410, a bank selector 415, a mask bank clock demultiplexer 432, a mask selection multiplexer 434, and multiple mask banks 376A through 376D (collectively referred to as "mask banks 376"). The mask module 372 of FIG. 4 allows more than one mask pattern to be used in each test cycle. The mask module 372 receives control data 401 including mask patterns from mask registers 371, stores the mask patterns, and sends multiple mask patterns to compressor 312 during a test cycle. Each of the stored mask patterns may be used for the same number of clock cycles. For instance, if the mask module 372 of FIG. 4 allows the usage of four mask patterns in each test cycle, each mask pattern may be used for one quarter of the test cycle. Alternatively, each of the stored mask patter may be used for a different number of clock cycles.

In addition to the control data 401 illustrated in FIG. 3A, other control data bits can be received via line 331. For example, mask selection bit 426, mask bank selection bits 424, and programmable interval length bits 422 may be received via line 331.

In some embodiments, the mask module 372 may include a plurality of mask banks 376, a mask bank clock demultiplexer 432, a mask selection multiplexer 434, a counter 410 and a bank selector 415. The mask banks 376A through 376D (hereinafter collectively referred to as "the mask banks 376") store multiple sets of mask patterns. In FIG. 4, four mask banks 376A through 376D are shown but in practice, a larger or smaller number of mask banks can be included in the mask module 372. In one embodiment, the number of mask banks is a power of 2 (e.g., 1, 2, 4, 8, 16, etc). Alternatively, any number of mask banks may be used in the mask module 372.

Each of the mask banks 376 includes a plurality of registers. Each register of a mask bank 376 stores one bit of a mask pattern. Mask banks 376 may also store additional input bits, such as mask selection bits 426. Every register in a specific mask bank 376 may be clocked by a single clock. Therefore, every register in a mask bank 376 is updated at the same time. Additionally, each mask bank of the plurality of mask banks 376 may be clocked with a different clock so that each mask bank 376 is updated independently.

The mask bank clock demultiplexer 432 selects a mask bank to store the bit values in mask data registers 322. The mask bank clock demultiplexer 432 may be controlled by the mask bank selector bits 424. In some embodiments, during each test cycle, only one register bank 376 can be loaded with a mask pattern. Other mask patterns may then be loaded during subsequent test cycles. That is, a first mask pattern may be loaded in a first mask bank 376A during a first test cycle, and a second mask pattern may be loaded in a second mask bank 376B during a second test cycle. The mask bank 376 for loading a new mask may be specified using the mask bank selection bits 424.

The mask bank clock demultiplexer 432 may have one control input 440 receiving the mask bank selector bits 424, one data input 436 receiving a clock signal, and multiple data outputs 438. Each data output of the mask bank clock demultiplexer 432 may be coupled to the clock input of different mask banks 376. The mask bank clock demultiplexer 432 routes the clock signal received through to the input 436 of the mask bank clock demultiplexer 432 to one of the mask banks 376 coupled to the outputs 438 of the mask bank clock demultiplexer 432, as specified by the mask bank selector bits 424. One of the data outputs 438 of the mask bank clock demultiplexer 432, as selected by the mask bank selector bits 424, outputs a clock signal to one of the mask banks 376. In one embodiment, the other outputs of the mask bank clock demultiplexer 432 output an inactive signal.

In one embodiment, the mask bank clock demultiplexer 432 may include additional control inputs 440 to select more than one data outputs to route the clock signal couple to the data input, thus allowing for a mask pattern to be stored in multiple mask banks in a single test cycle. For example, for a certain test pattern, the ATPG/FS 202 may determine that the number of faults tested may be increased by using a specific mask pattern in the first mask bank 376A and in the third mask bank 376C. If the mask bank clock demultiplexer 432 includes control inputs that receives signals that cause the mask bank clock demultiplexer 432 to route the clock signal to multiple mask banks, the mask pattern provided in the current test cycle can be stored in multiple mask banks (e.g., in the first mask bank 376A and the third mask bank 376C).

Alternatively, the mask bank clock demultiplexer 432 may include a control input to disable all of its data outputs. In such implementation, if the mask patterns stored in the mask banks 376 are suitable for the next test pattern, a new mask pattern need not be provided and none of the mask banks 376 is updated until ATPG/FS 202 determines to use a new mask to increase the number of faults that can be tested.

The counter 410 keeps count of the number of clock cycles during which a current mask pattern has been used. The programmable interval length bits 422 may be used to identify the number of clock cycles during which a particular mask pattern is used. For instance, if a test cycle is 128 clock cycles long (i.e., the scan chain has a length of 128), the programmable interval length bits 422 may specify that a particular mask patter will be used for 32 clock cycles. In such an example, a different mask bank 376 is selected to provide a mask pattern to compressor 312 every 32 clock cycles. The counter 410 may count up or down and send out a signal 442 to the bank selector 415 when a predetermined count specified by the programmable interval length bits 422 is reached, and then reset the count. The mask bank control logic 374 may include an interval register bank 405 to store the programmable interval length bits 422. The counter 410 may load the number stored in the interval register bank 405 and count down to a number or count up until the number stored in the interval register bank 405 is reached before sending a signal to the bank selector 415 and resetting the counter 410.

In embodiments where only one mask pattern can be loaded during each test cycle, only one valid mask pattern will be stored in the mask banks 376 in the first test cycle. Therefore, the programmable interval length bits 422 may be equal to the length of the scan chain (e.g., 128). As a result, when the counter reaches the maximum value, the current test cycle will end and only the mask pattern present in the first mask bank 376A will be used by the compressor 312. In the second test cycle, at most two valid mask patterns will be loaded into the mask banks 376. Therefore, the programmable interval length bits 422 may be greater or equal to half the scan chain length (e.g., 64). The process may be repeated until all mask banks 376 are loaded with a valid mask patter.

Even when all mask banks 376 are loaded with valid mask patterns, the programmable interval length bits 422 can be chosen so that only some of the mask patterns are used. For example, if the length of the scan chain is 128 (i.e., the number of rows in the scan chain is 128), the programmable interval length bits 422 is chosen to be 128, only the first mask pattern will be used. Alternatively, if the programmable interval length bits 422 multiplied by the number of mask banks 376 is less than the length of the scan chain, the bank selector 415 may select the mask banks 376 in a round-robin manner. For instance, if the length of the scan chain is 128 (i.e., the number of rows in the scan chain is 128) and the programmable interval length bits 422 is chosen to be 16, then the bank selector 415 may select mask bank 376A for scan chain rows 1-16 and 65-80, mask bank 376B for scan chain rows 17-32 and 81-96, mask bank 376C for scan chain rows 33-48 and 97-112, mask bank 376D for scan chain rows 49-64 and 113-128.

The bank selector 415 selects one of the mask banks 376 to be sent to the compressor 312. The bank selector 415 selects a different mask bank 376 each time the bank selector 415 receives a signal 442 from the counter 410. The bank selector 415 may be embodied as a counter that counts from 0 up to the number of mask banks 376 minus one (e.g., form 0 to 3, or a modulo 4 counter). The bank selector 415 may increase the count each time bank selector 415 receives a signal form the counter 410.

The bank selector may select the mask banks in a sequential manner. For example, the bank selector 415 starts with the first mask bank 376A at the beginning of a test cycle, switches to the second mask bank 376B after receiving a signal form counter 410, switches to the third mask bank 376C after receiving another signal form counter 410 and so on. The bank selector 415 may use a round-robin algorithm, in which the bank selector 415 switches to the first mask bank 376A after the last mask bank 376D was selected. In one embodiment, the bank selector 415 resets to the first mask bank 376A at the beginning of each test cycle. Alternatively, the bank selector 415 may include a control input signal to specify which mask bank 376 will be selected first. For example, if the second mask bank 376B is specified as the first bank selected, the bank selector 415 may select the mask banks 376 in a sequential order starting from the second mask bank 376B (i.e., bank selector 415 selects second mask bank 376B at the beginning of the test cycle, switches to third mask bank 376C after receiving a signal from counter 410, switches to forth mask bank 376D after receiving a signal from counter 410, and so on).

The bank selector 415 may also receive a control input signal to specify the switching direction of mask banks 376. For example, if a forward direction is specified, bank selector 415 starts with the first mask bank 376A at the beginning of a test cycle, switches to the second mask bank 376B after receiving a signal form counter 410, switches to the third mask bank 376C after receiving another signal form counter 410 and so on. If a reverse direction is specified, then bank selector 415 starts with the first mask bank 376A at the beginning of a test cycle, switches to the fourth mask bank 376D after receiving a signal from counter 410, switches to the third mask bank 376C after receiving another signal form counter 410, and so on.

Alternatively, the bank selector 415 may select the mask banks 376 using a different sequence or algorithm. For instance, the control data bits received from line 331 may include additional bits to specify the bank selection sequence.

The mask selection multiplexer 434 is configured to receive the mask patterns from every mask bank 376 and output a single mask pattern based on a signal received from the bank selector 415.

Figure 5:
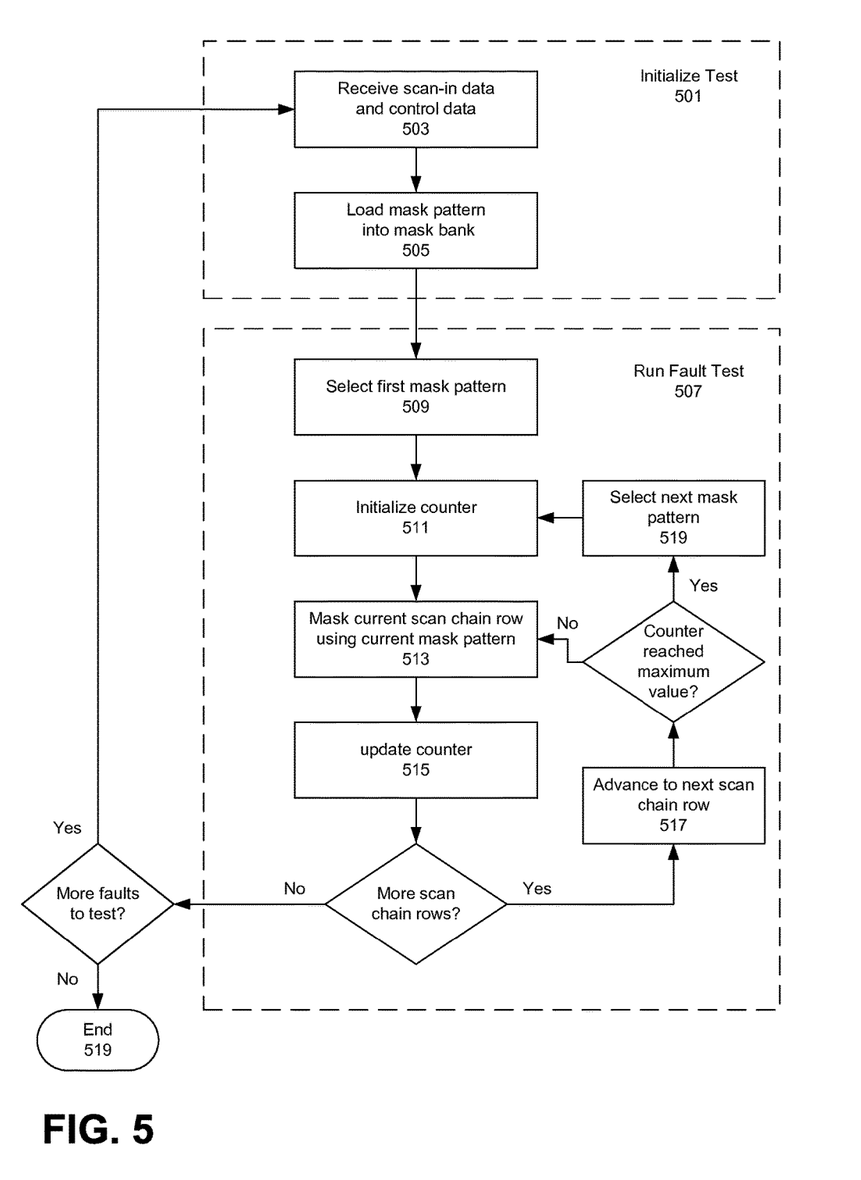
FIG. 5 is a flowchart illustrating a method for testing faults using multiple mask patterns, according to one embodiment.

FIG. 5 is a flow diagram of a process for testing faults in an integrated circuit, according to one embodiment. The process for testing faults is divided into two different stages: test initiation 501 and fault test run 507. During test initialization 501, scan-in data and control data is received 503 via line 331. The mask pattern included in the control data received 503 via the line 331 is loaded 505 into a mask bank selected from a plurality of mask banks 376. The mask bank 376 is selected based on the mask bank selection bits 424 included in the control bits received via line 331.

During the fault test 507, the first mask pattern 376A is selected 509 and the counter 410 is initialized 511. The current scan chain row is masked 513 at the compressor 312 using the selected mask pattern and the counter 410 is updated 515. If there are more scan chain rows to unload, the test circuit advances to the next scan chain row. If the counter reached the number specified by the programmable interval length bits 422 included in the control data received via line 331, the counter 410 is reset (i.e., initialized 511) and the next mask pattern is selected 519. Otherwise, if the counter has not reached the number specified by the programmable interval length bits 422, the current mask is used to mask 513 the scan chain row. This process is repeated until all rows of the scan chain have been unloaded. When there are no more scan chain rows to be unloaded during the current test cycle, the ATPG/FS 202 determines whether there are more test faults to test. If there are more test faults to test, a new test pattern, including scan-in data and control data, is generated and sent to the test circuit. Otherwise, if there are no more faults to test, the process ends 521.

Figure 6:
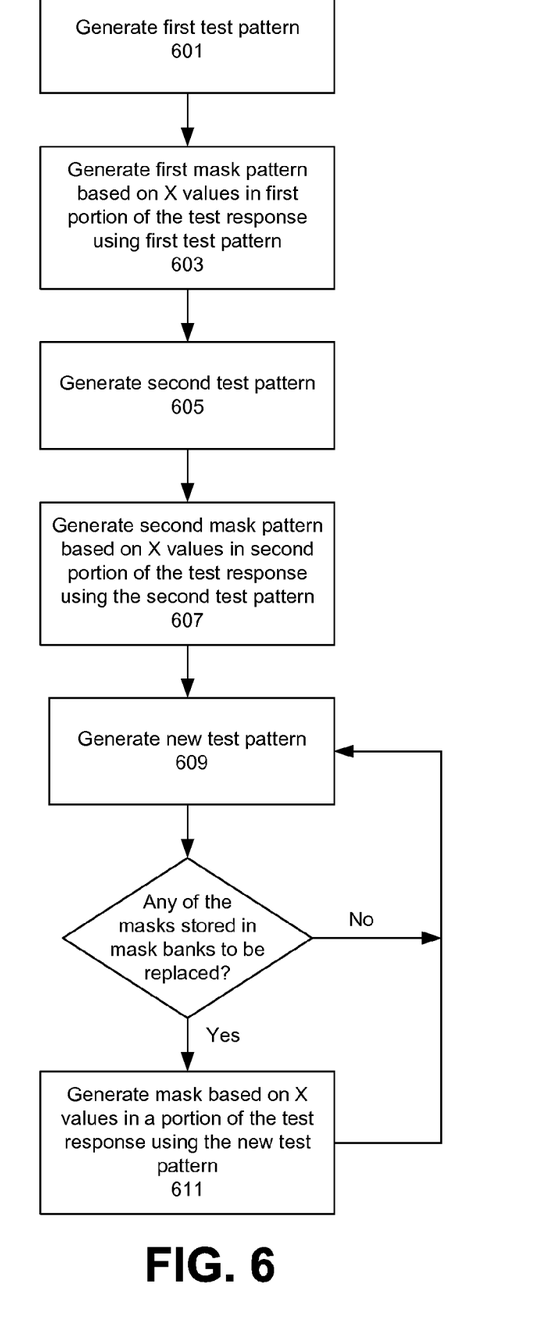
FIG. 6 is a flowchart of a process illustrating generating mask patterns, according to one embodiment.

FIG. 6 is a flow diagram of a process for generating mask patterns, according to one embodiment. The ATPG/FS 202 generates 601 a first test pattern. A first mask pattern is generated 603 based on X values in a first portion of the response obtained using the first test pattern. For example, the first mask pattern is generated based on X values in the first half, or the first quarter of the response of the test circuit using the first test pattern. The response of the test circuit may be determined by the ATPG/FS 202 by simulating the circuit using the test patter as an input.

The first test pattern is loaded into the test circuit, and the first mask pattern is stored in a first mask bank 376A. The DUT 206 is tested using the generated first test pattern and the first mask pattern.

The ATPG/FS 202 generates 605 a second test pattern. A second mask pattern is generated 607 based on the X values in a second portion of the response obtained using the second test pattern. For example, the second mask pattern is generated based on the X values in the second half, or the second quarter of the response of the test circuit using the second test pattern.

The second test pattern is loaded into the test circuit, and the second mask pattern is stored in a second mask bank 376B. The DUT 206 is tested using the generated second test pattern, the first mask pattern and the second mask pattern.

A new test pattern is generated 609. A determination is made whether to replace a mask pattern stored in a mask bank of the plurality of mask banks 376. If a determination is made to replace a mask pattern, a new mask pattern is generated based on the X values in a portion of the response of the test circuit using the new test pattern. For instance, if the first mask pattern is to be replaced, the new mask pattern is generated based on the X values in a first portion (e.g., first half or first quarter) of the response of the test circuit using the new test pattern. If the second mask pattern is to be replaced, the new mask pattern is generated based on the X values in a second portion (e.g., second half or second quarter) of the response of the test circuit using the new test pattern.

The new test pattern is loaded into the test circuit, and the new mask pattern is stored is a mask bank 376. For instance, if a determination to replace the first mask is made, the new mask pattern is stored in the first mask bank 376A and the DUT 206 is tested using the generated new test pattern, the new mask pattern and the second mask pattern. Alternatively, if a determination to replace the second mask pattern is made, the new mask pattern is stored in the second mask bank 376B and the DUT 206 is tested using the generated new test pattern, the first mask pattern and the new mask pattern.

If a determination is made not to replace any mask patterns stored in a mask bank of the plurality of mask banks 376, a new mask pattern is not generated. The new test pattern is loaded into the test circuit and the DUT is tested using the new test pattern, the first mask pattern and the second mask pattern.

The ATPG/FS 202 generates 609 a new test pattern, and this process is repeated until all test patterns have been generated.

Figure 7:
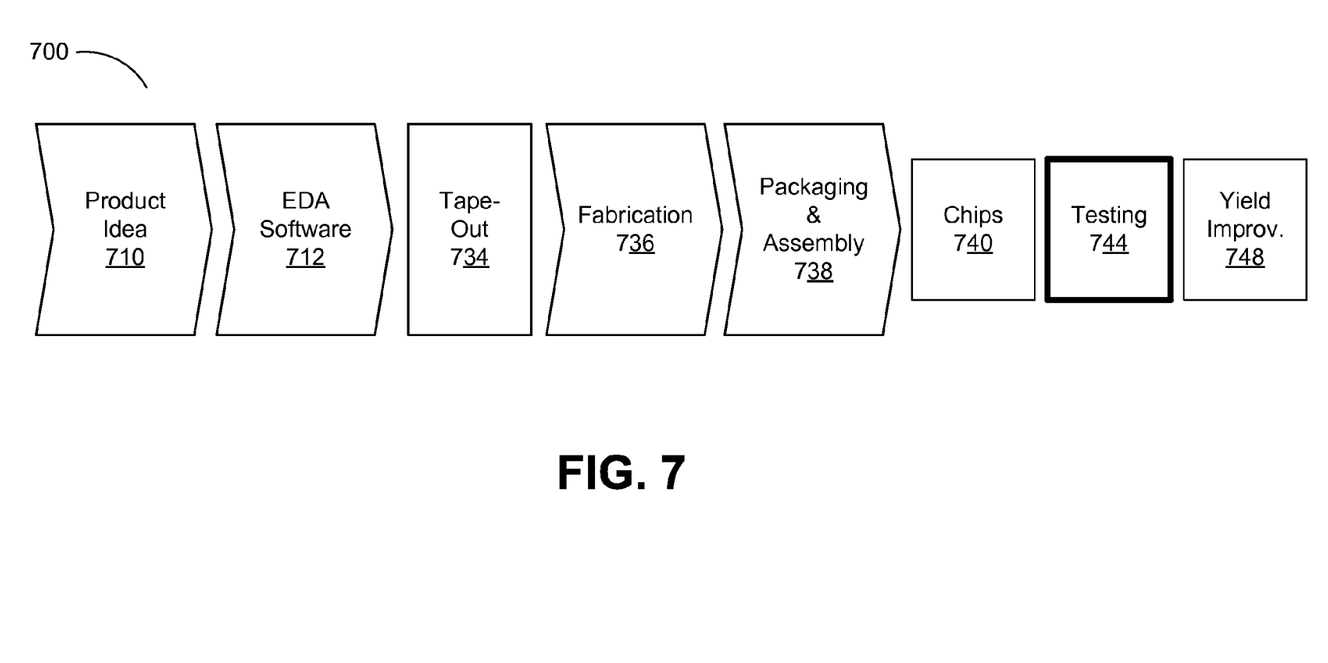
FIG. 7 is a flowchart illustrating the various operations in the design and fabrication of an integrated circuit.

FIG. 7 is a flowchart 700 illustrating the various operations in the design and fabrication of an integrated circuit. This process starts with the generation of a product idea 710, which is realized during a design process that uses electronic design automation (EDA) software 712. When the design is finalized, it can be taped-out 734. After tape-out, a semiconductor die is fabricated 736 to form the various objects (e.g., gates, metal layers, vias) in the integrated circuit design. Packaging and assembly processes 738 are performed, which result in finished chips 740. Chips are then tested 744 to detect faults. Based on the detected faults in the tested chips, measures can be taken to improve yield 748 in subsequent batch of chips to be fabricated. Embodiments described above primarily related to testing 744 the chips for faults.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

While particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope of this disclosure.

What is claimed is:

1. A method for masking scan chains in a test circuit of an integrated circuit, comprising:
    storing a plurality of mask patterns in the test circuit, each of the mask patterns stored in each of a plurality of mask banks in the test circuit;
    initializing a counter;
    controlling a multiplexer to couple an output of a first bank storing a first mask pattern to an input of a compressor of the test circuit;
    masking an output of the scan chains of the test circuit in a test cycle by using the first mask pattern selected among the plurality of mask patterns;
    updating the counter; and
    responsive to the counter reaching a set value:
        controlling the multiplexer to couple an output a second bank storing a second mask pattern to the input of the compressor of the test circuit, and
        masking the output of the scan chains of the test circuit in a same test cycle by using the second mask pattern selected among the plurality of mask patterns.

2. The method of claim 1:
    wherein the first mask pattern is used at the beginning of the test cycle and the second mask pattern is used before an end of the test cycle; and
    wherein the first mask pattern is further used after the using the second mask pattern and before the end of the test cycle.

3. The method of claim 2, wherein the mask patterns are used in a round-robin manner.

4. The method of claim 1, further comprising receiving control bits from a test input pin of the integrated circuit, the control bits including a mask bank selection bit indicating selection of one of the mask patterns to mask the output of the scan chains.

5. The method of claim 4, wherein the control bits further comprises interval length control bits indicating a number of clock cycles during which the first or the second mask pattern is used, and further comprising:
setting a counter by the interval length control bits to generate a signal indicating switching from the first mask pattern to the second mask pattern.

6. The method of claim 1, storing the plurality of mask patterns comprises:
receiving a first test pattern including the first mask pattern during the test cycle;
storing the first mask pattern in a first mask bank of test circuit responsive to receiving the first test pattern;
receiving a second test pattern including the second mask pattern during another test cycle; and
storing the second mask pattern in a second mask bank of the test circuit responsive to receiving the second test pattern.

7. A test circuit in an integrated circuit comprising:
a compressor coupled to receive and compress scan outputs from scan chains;
a counter;
a plurality of mask banks, each of the mask banks configured to store a mask pattern; and
a multiplexer between the compressor and the mask banks, the multiplexer configured to:
couple an output of a first mask bank storing a first mask pattern to an input of the compressor of the test circuit in response to the counter having a value lower than a set value,
couple an output a second mask bank storing a second mask pattern to the input of the compressor of the test circuit in response to the counter reaching the set value;
wherein the compressor is configured to:
mask an output of the scan chains of the test circuit in a test cycle by using the first mask pattern selected among the plurality of mask patterns in response the multiplexer coupling the output of the first mask bank to the input of the compressor, and
mask the output of the scan chains of the test circuit in a same test cycle by using the second mask pattern selected among the plurality of mask patterns in response to the multiplexer coupling the output of the second mask bank to the input of the compressor.

8. The test circuit of claim 7, further comprising:
a counter coupled to the multiplexer and configured generate a counter signal indicative of the first period and the second period based on a clock signal; and
a bank selector coupled between the counter and the multiplexer, the bank selector configured to generate a select signal representing a selected mask bank responsive to receiving the counter signal.

9. The test circuit of claim 7, further comprising a mask bank clock demultiplexer having a plurality of outputs, each output coupled to a clock input of a mask bank from the plurality of mask banks to select a mask bank for storing a mask pattern.

10. The test circuit of claim 9, further comprising a register coupled to a test input pin of the integrated circuit to receive and store control bits, the control bits comprising a mask pattern and mask bank selection bits, the mask bank clock demultiplexer configured to select one mask bank of the plurality of mask banks to load the mask pattern into the selected mask bank.

11. The test circuit of claim 10, wherein the control bits further comprise interval length bits specifying a modulo of the counter.

12. A non-transitory computer readable medium configured to store a design of a test circuit of an integrated circuit, the design of the test circuit comprising:
a compressor coupled to receive and compress scan outputs from scan chains;
a counter;
a plurality of mask banks, each of the mask banks configured to store a mask pattern; and
a multiplexer between the compressor and the mask banks, the multiplexer configured to:
couple an output of a first bank storing a first mask pattern to an input of a compressor of the test circuit in response to the counter having a value lower than a set value,
couple an output a second bank storing a second mask pattern to the input of the compressor of the test circuit in response to the counter reaching the set value;
wherein the compressor is configured to:
mask an output of the scan chains of the test circuit in a test cycle by using the first mask pattern selected among the plurality of mask patterns in response the multiplexer coupling the output of the first mask bank to the input of the compressor, and
mask the output of the scan chains of the test circuit in a same test cycle by using the second mask pattern selected among the plurality of mask patterns in response to the multiplexer coupling the output of the second mask bank to the input of the compressor.

13. The non-transitory computer readable medium of claim 12 wherein the first mask bank is selected at the beginning of a test cycle, and the second mask bank is selected before the end of the test cycle.

14. The non-transitory computer readable medium of claim 13 wherein the first mask bank is further selected during a third period, the third period being after the second period, and the third period being before the end of the test cycle.

15. The non-transitory computer readable medium of claim 13 wherein the mask banks are selected in a round-robin manner.

16. The non-transitory computer readable medium of claim 15, wherein the design of the test circuit further comprises:
a counter coupled to the multiplexer and configured generate a counter signal indicative of the first period and the second period based on a clock signal; and
a bank selector coupled between the counter and the multiplexer, the bank selector configured to generate a select signal representing a selected mask bank responsive to receiving the counter signal.

17. The non-transitory computer readable medium of claim 15 wherein the design of the test circuit further comprises a mask bank clock demultiplexer having a plurality of outputs, each output coupled to a clock input of a mask bank from the plurality of mask banks to select a mask bank for storing a mask pattern.

18. The non-transitory computer readable medium of claim 17 wherein the design of the test circuit further comprises a register coupled to a test input pin of the integrated circuit to receive and store control bits, the control bits comprising a mask pattern and mask bank selection bits, the mask bank clock demultiplexer configured to select one mask of the plurality of mask banks to load the mask pattern into the selected mask bank.

19. The non-transitory computer readable medium of claim 18 wherein the control bits further comprises interval length bits specifying a modulo of the counter.

* * * * *

UNITED STATES PATENT AND TRADEMARK OFFICE
CERTIFICATE OF CORRECTION

PATENT NO. : 10,067,187 B2  
APPLICATION NO. : 14/335720  
DATED : September 4, 2018  
INVENTOR(S) : Anshuman Chandra et al.

Page 1 of 1

It is certified that error appears in the above-identified patent and that said Letters Patent is hereby corrected as shown below:

In the Claims

Column 12, Lines 46-47, Claim 1, delete "output a second bank" and insert --output of a second bank--.
Column 12, Lines 56-57, Claim 2, delete "after the using the" and insert --after using the--.
Column 13, Line 30, Claim 7, delete "output a second bank" and insert --output of a second bank--.
Column 13, Lines 37-38, Claim 7, delete "in response the multiplexer" and insert --in response to the multiplexer--.
Column 13, Lines 46-47, Claim 8, delete "configured generate" and insert --configured to generate--.
Column 14, Line 16, Claim 12, delete "a second bank" and insert --of a second bank--.
Column 14, Lines 23-24, Claim 12, delete "in response the multiplexer" and insert --in response to the multiplexer--.
Column 14, Lines 47-48, Claim 16, delete "configured generate" and insert --configured to generate--.
Column 15, Line 2, Claim 19, delete "further comprises" and insert --further comprise--.

Signed and Sealed this
Twelfth Day of March, 2019

Andrei Iancu
*Director of the United States Patent and Trademark Office*